United States Patent [19]
Vorel

[11] Patent Number: 5,260,672
[45] Date of Patent: Nov. 9, 1993

[54] VOLTAGE FOLLOWER CIRCUIT

[75] Inventor: Anton Vorel, Eggenfelden, Fed. Rep. of Germany

[73] Assignee: Texas Instruments Deutschland GmbH, Fed. Rep. of Germany

[21] Appl. No.: 916,229

[22] Filed: Jul. 17, 1992

[51] Int. Cl.[5] ............................................. H03F 3/45
[52] U.S. Cl. .................................... 330/257; 330/260
[58] Field of Search ............... 330/257, 260, 288, 310, 330/311

[56] References Cited

U.S. PATENT DOCUMENTS 3,614,645  10/1971  Wheatley, Jr. .................. 330/260 X

*Primary Examiner*—James B. Mullins
*Attorney, Agent, or Firm*—William E. Hiller; Richard L. Donaldson

[57] ABSTRACT

A voltage follower circuit comprising an input (10) for applying an input voltage and an output (20) for emitting an output voltage dependent on the input voltage includes a first current mirror circuit (Q1, Q3) having an input transistor (Q1) and an output transistor (Q3), the current flowing through the input transistor (Q1) depending on the input voltage and the output voltage being generated in dependence upon the current through the output transistor (Q3). Associated with the output transistor (Q3) of the first current mirror circuit (Q1, Q3) is a further input transistor (Q4) which with said output transistor (Q3) forms a second current mirror circuit (Q3, Q4). In the collector line of the further input transistor (Q4) a constant current source (K2) is disposed which impresses a constant current onto the second current mirror circuit (Q4, Q3).

6 Claims, 1 Drawing Sheet

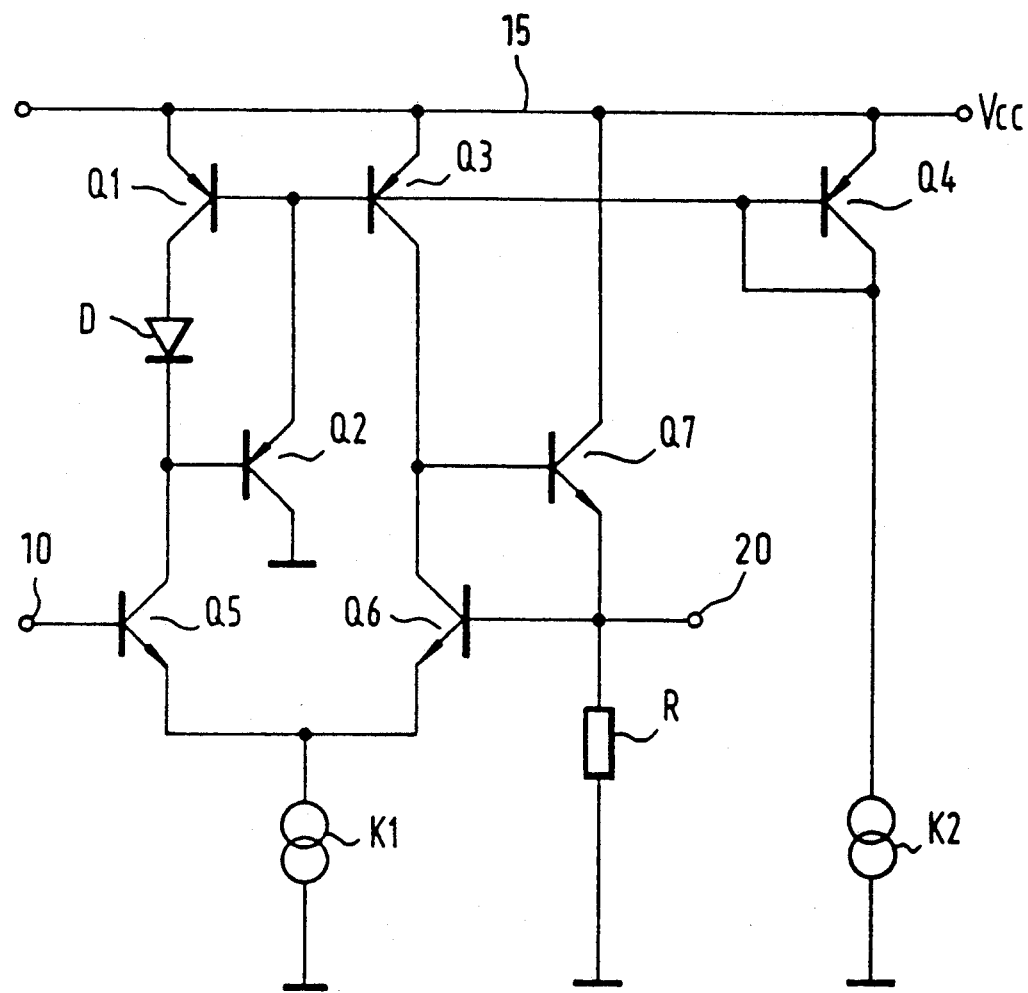

VOLTAGE FOLLOWER CIRCUIT

The invention relates to a voltage follower circuit comprising an input for applying an input voltage and an output for emitting an output voltage dependent on the input voltage, and a first current mirror circuit having an input transistor and an output transistor, the current flowing through the input transistor being dependent on the input voltage and the output voltage being generated in dependence upon the current through the output transistor.

A voltage follower circuit of this type can be made up using the operational amplifier of the type TL 052 made by the company Texas Instruments Incorporated, the circuit diagram of which is illustrated in the handbook issued by that company "Linear Circuits, Data Book, Volume 1", 1989, on p. 2-300. When this operational amplifier is used as voltage follower it becomes an impedance transformer having a high-impedance input and a low-impedance output. The operational amplifier includes a current mirror circuit as illustrated in the book "Electrical properties of linear integrated circuits" of the company VALVO in the November 1977 edition, in particular FIG. 6.13. The operational amplifier as voltage follower with this conventional configuration can be used only for a limited input voltage range because whenever the input voltage (depending on the polarity of the transistors used) tends towards the value of the supply voltage or towards the ground value or exceeds said values, the output voltage no longer corresponds to the input voltage and consequently the voltage follower function is no longer ensured.

The invention is based on the problem of configuring a voltage follower circuit of the type set forth at the beginning in such a manner that it retains its functionability in a large input voltage range.

This problem is solved according to the invention in that associated with the output transistor of the first current mirror circuit is a further input transistor which with said output transistor forms a second current mirror circuit and that in the collector line of the further input transistor a constant current source is disposed which impresses a constant current onto the second current mirror circuit.

In the voltage follower circuit according to the invention the output voltage still remains at a high voltage level when the input voltage assumes the value of the supply voltage or exceeds said value. Consequently, following circuits which are to perform specific functions depending on whether the input voltage is high or low can still perform the corresponding function associated with a high input voltage even in the limit case of a very high input voltage.

An advantageous further development of the invention is set forth in claim 2.

An example of embodiment of the invention will now be explained with reference to the drawing, the single Figure of which shows a circuit diagram of the voltage follower circuit according to the invention.

The voltage follower circuit illustrated in the drawing includes a first current mirror circuit having two PNP transistors Q1 and Q3. The transistor Q1 is the input transistor and the transistor Q3 is the output transistor. Into the direct connection provided with conventional current mirror circuits between the connected base terminals of the two transistors Q1 and Q3 and the collector of the input transistor Q1 in the case of the circuit to be described here a PNP transistor Q2 is inserted, the emitter of which is connected to the base terminals of the two transistors Q1 and Q3 and the collector of which is connected to ground. In the case of the voltage follower circuit to be described here, into the collector line of the input transistor Q1 a diode D is inserted, the purpose of which is still to be explained. The base terminal of the transistor Q2 is connected to the cathode of the diode D.

The input voltage to be processed in the voltage follower circuit is applied to the input terminal 10 which is connected directly to the base terminal of an NPN transistor Q5. The collector terminal of said transistor Q5 is connected to the base terminal of the transistor Q2 and the cathode of the diode D. The emitter terminal of the transistor Q5 is connected to the emitter terminal of the further NPN transistor Q6 which is inserted symmetrically with the transistor Q5 into the current mirror circuit formed by the transistors Q1 and Q3. The collector terminal of the transistor Q6 is connected to the collector terminal of the transistor Q3. The interconnected emitter terminals of the two transistors Q5 and Q6 are connected to a constant current source K1, the second terminal of which is applied to ground.

Also connected to the interconnected collector terminals of the transistors Q3 and Q6 is the base terminal of an NPN transistor Q7, between the emitter terminal of which and ground a resistor R is disposed. The collector terminal of the transistor Q7, like the emitter terminals of the transistors Q1 and Q3, is connected to a supply voltage line 15 on which there is a positive supply voltage $V_{cc}$. The base terminal of the transistor Q6 is connected to the connection point between the emitter terminal of the transistor Q7 and the resistor R. The output voltage is tapped by means of the output terminal 20 from said connection point.

The voltage follower circuit described above is completely functionable and furnishes at its output terminal 20 an output voltage dependent on the input voltage at the input terminal 10 for as long as the input voltage remains within a predetermined range. If for example the input voltage lies substantially in the middle between the ground value and the value of the positive supply voltage $V_{cc}$, a current will flow through the transistor Q5 having a value which is governed by the constant current source K1 and due to the properties of the current mirror circuit in conjunction with the transistor Q7 in the ideal case the same current will flow through the transistor Q6. Part of the collector current of the transistor Q3 acts as base current for the transistor Q7, through the collector-emitter path of which a current flows which generates at the resistor R a voltage drop such that the output voltage at the output terminal 20 is equal to the input voltage at the input terminal 10.

If however the input voltage tends towards the value of the supply voltage $V_{cc}$ practically the entire current defined by the constant current source K1 will flow through the base-emitter path of the transistor Q5 and consequently no current is left for the transistor Q6. This means that no current can flow through the transistor Q3 either and consequently the transistor Q7 also driven by the current through the transistor Q3 is rendered nonconductive as well. Since in the nonconductive state of the transistor Q7 no current flows through the resistor R, in this state the output voltage at the output terminal 20 changes to the value zero. This would mean however that the output voltage would no longer correspond to the input voltage, as is desired for a voltage follower circuit.

To avoid the disadvantageous behavior outlined, the circuit contains a further PNP transistor Q4 which is inserted into the circuit in such a manner that together with the transistor Q3 it forms a second current mirror circuit. The transistor Q4 here forms the input transistor for the second current mirror circuit and the transistor Q3 forms the output transistor thereof. As usual in a current mirror circuit, in the input transistor Q4 the collector terminal is connected to the base terminal. Between the collector terminal and ground a second constant current source K2 is inserted.

By adding the second current mirror circuit consisting of the transistors Q3 and Q4, ensuring that a current impressed by the constant current source K2 always flows through the output transistor Q3, the transistor Q7 is prevented from becoming nonconductive even when due to a high input voltage at the input terminal 10 in the range of the supply voltage $V_{CC}$ practically the entire current of the constant current source K1 flows through the transistor Q5 and no current is left for the circuit branch containing the transistor Q3. The current impressed into the circuit branch containing the transistor Q3 due to the second current mirror circuit thus ensures that even at high input voltages the voltage at the output terminal 20 still provides information on whether the input voltage is high or low. The voltage follower function is thus retained in a very wide range of input voltages, even when the input voltage exceeds the value of the supply voltage $V_{CC}$.

The diode D is inserted into the collector line of the transistor Q1 to prevent that at an input voltage which is greater than the supply voltage $V_{CC}$ no current can flow from the source furnishing the input voltage to the current source K2. This would cancel out the function of the additional current mirror. Moreover, the source furnishing the input voltage might possibly be undesirably highly loaded.

We claim:

1. A voltage follower circuit comprising:
   an input for applying an input voltage;
   a first current mirror circuit for connection to a voltage supply source and having an input transistor and an output transistor respectively including base, emitter and collector electrodes;
   a second current mirror circuit for connection to the voltage supply source and having an input transistor including base, emitter and collector electrodes, the output transistor of said first current mirror circuit also being the output transistor of said second current mirror circuit;
   a control circuit connected to the collector electrodes of said input and output transistors of said first current mirror circuit and symmetrically inserted into said first current mirror circuit;
   said input being connected to said control circuit;
   a first constant current source connected to said control circuit;
   a second constant current source connected to the collector electrode of said input transistor of said second current mirror circuit for impressing a constant current through said second current mirror circuit; and
   an output connected to said control circuit, the output voltage at said output being dependent upon the input voltage at said input;
   the current flowing through said input transistor of said first current mirror circuit being dependent upon the input voltage and the output voltage being generated in dependence upon the current through said output transistor of said first and second current mirror circuits.

2. A voltage follower circuit as set forth in claim 1, wherein said control circuit comprises first and second control transistors respectively including base, emitter and collector electrodes, the collector electrodes of said first and second control transistors being respectively connected to said collector electrodes of said input transistor and said output transistor of said first current mirror circuit, the emitter electrodes of said first and second control transistors being connected together; and
   said first constant current source being connected to said control circuit at a point between the emitter electrodes of said first and second control transistors.

3. A voltage follower circuit as set forth in claim 2, wherein said input and output transistors of said first and second current mirror circuits are PNP transistors; and
   said first and second control transistors of said control circuit are NPN transistors.

4. A voltage follower circuit as set forth in claim 1, wherein the constant current impressed by said second constant current source through said second current mirror circuit is on the order of magnitude of 1/10th of the current flowing in said first current mirror circuit.

5. A voltage follower circuit as set forth in claim 1, further including a diode connected to the collector electrode of said input transistor of said first current mirror circuit and to said control circuit for preventing current flow from said input to said input transistor of said first current mirror circuit.

6. A voltage follower circuit as set forth in claim 1, further including a voltage supply transistor having base, emitter and collector electrodes for connection to the voltage supply source via the collector electrode thereof;
   a resistor connected to the emitter electrode of said voltage supply transistor at one end thereof and to ground at the other end thereof;
   the collector electrode of said output transistor of said first current mirror circuit being connected to the base electrode of said voltage supply transistor; and
   said voltage supply transistor being rendered conductive in response to current applied by the collector electrode of said output transistor of said first current mirror circuit to the base electrode of said voltage supply transistor for providing a voltage drop at said resistor to produce an output voltage at said output equal to the input voltage at said input.

* * * * *